United States Patent
Konstantinov

(10) Patent No.: US 9,577,045 B2
(45) Date of Patent: Feb. 21, 2017

(54) SILICON CARBIDE POWER BIPOLAR DEVICES WITH DEEP ACCEPTOR DOPING

(71) Applicant: FAIRCHILD SEMICONDUCTOR CORPORATION, San Jose, CA (US)

(72) Inventor: Andrei Konstantinov, Sollentuna (SE)

(73) Assignee: Fairchild Semiconductor Corporation, San Jose, CA (US)

(*) Notice: Subject to any disclaimer, the term of this patent is extended or adjusted under 35 U.S.C. 154(b) by 0 days.

(21) Appl. No.: 14/671,561

(22) Filed: Mar. 27, 2015

(65) Prior Publication Data
US 2016/0035836 A1 Feb. 4, 2016

Related U.S. Application Data

(60) Provisional application No. 62/032,935, filed on Aug. 4, 2014.

(51) Int. Cl.
*H01L 29/16* (2006.01)
*H01L 29/167* (2006.01)
(Continued)

(52) U.S. Cl.
CPC ...... *H01L 29/1608* (2013.01); *H01L 29/1004* (2013.01); *H01L 29/167* (2013.01); *H01L 29/42304* (2013.01); *H01L 29/66068* (2013.01); *H01L 29/732* (2013.01); *H01L 29/7395* (2013.01); *H01L 29/74* (2013.01); *H01L 29/66234* (2013.01)

(58) Field of Classification Search
CPC ......... H01L 29/42304; H01L 29/66068; H01L 29/1608; H01L 29/1004; H01L 29/1012; H01L 29/167
See application file for complete search history.

(56) References Cited

U.S. PATENT DOCUMENTS

| 4,775,883 A | 10/1988 | Borchert et al. |
| 5,169,798 A | 12/1992 | Eaglesham et al. |

(Continued)

FOREIGN PATENT DOCUMENTS

| GB | 1142405 A | 2/1969 |
| GB | 1206159 A | 9/1970 |

(Continued)

OTHER PUBLICATIONS

Baei et al., "Effect of Gallium Doping on Electronic and Structural Properties (6,0) ZigzagSilicon Carbide Nanotube as a p-Semiconductor", Journal of Cluster Science, vol. 23, Issue 4 , Aug. 4, 2012, pp. 1119-1132.

(Continued)

*Primary Examiner* — Jose R Diaz
(74) *Attorney, Agent, or Firm* — Brake Hughes Bellermann LLP

(57) ABSTRACT

In a general aspect, a power semiconductor device can include a collector region disposed on a substrate, the collector region can include n-type silicon carbide (SiC). The power semiconductor device can also include a base region disposed on the collector region. The base region can include p-type SiC doped with gallium. The power semiconductor device can include an emitter region disposed on the base region. The emitter region can include n-type SiC carbide.

24 Claims, 7 Drawing Sheets

(51) Int. Cl.
  *H01L 29/10*    (2006.01)
  *H01L 29/74*    (2006.01)
  *H01L 29/732*   (2006.01)
  *H01L 29/739*   (2006.01)
  *H01L 29/423*   (2006.01)
  *H01L 29/66*    (2006.01)

(56) References Cited

U.S. PATENT DOCUMENTS

| | | |
|---|---|---|
| 5,393,993 A | 2/1995 | Edmond et al. |
| 7,179,527 B2 | 2/2007 | Sato et al. |
| 7,364,808 B2 | 4/2008 | Sato et al. |
| 7,582,905 B2 | 9/2009 | Tamura et al. |
| 7,855,385 B2 | 12/2010 | Kamiyama et al. |
| 7,883,789 B2 | 2/2011 | Sato et al. |
| 8,247,793 B2 | 8/2012 | Nakahara et al. |
| 8,278,656 B2 | 10/2012 | Mattmann et al. |
| 8,785,945 B2 * | 7/2014 | Konstantinov ....... H01L 29/045 257/592 |
| 2005/0106423 A1 | 5/2005 | Fujita |
| 2005/0243706 A1 | 11/2005 | Lankhorst et al. |
| 2006/0169317 A1 | 8/2006 | Sato et al. |
| 2006/0267021 A1* | 11/2006 | Rowland ............ H01L 21/0455 257/77 |
| 2007/0176531 A1 | 8/2007 | Kinoshita et al. |
| 2008/0038531 A1 | 2/2008 | Sawamura et al. |
| 2008/0050595 A1 | 2/2008 | Nakagawara et al. |
| 2008/0073659 A1 | 3/2008 | Tamura et al. |
| 2008/0152868 A1 | 6/2008 | Sato et al. |
| 2008/0277670 A1 | 11/2008 | Kamiyama et al. |
| 2009/0117711 A1 | 5/2009 | Harle et al. |
| 2010/0090214 A1 | 4/2010 | Nakahara et al. |
| 2010/0116331 A1 | 5/2010 | Kobayashi et al. |
| 2010/0207116 A1 | 8/2010 | Mattmann et al. |
| 2010/0289004 A1 | 11/2010 | Nakahara et al. |
| 2011/0089418 A1 | 4/2011 | Yamamuro et al. |
| 2012/0040494 A1 | 2/2012 | Yamaguchi et al. |
| 2012/0074380 A1 | 3/2012 | Wang et al. |
| 2013/0023709 A1 | 1/2013 | Cizeron et al. |
| 2013/0087808 A1* | 4/2013 | Konstantinov ....... H01L 29/045 257/77 |
| 2013/0112992 A1 | 5/2013 | Kurtz et al. |
| 2013/0129945 A1 | 5/2013 | Durandeau et al. |
| 2013/0213469 A1 | 8/2013 | Kramer et al. |
| 2013/0228221 A1 | 9/2013 | Moslehi et al. |
| 2013/0292631 A1 | 11/2013 | Chin et al. |

FOREIGN PATENT DOCUMENTS

| | | |
|---|---|---|
| GB | 2428681 A | 2/2007 |
| JP | 58-161381 A | 9/1983 |
| JP | 2005-187791 A | 7/2005 |
| WO | 2005/090515 A1 | 9/2005 |

OTHER PUBLICATIONS

Kanechika et al., "Advanced SiC and GaN Power Electronics for Automotive Systems", IEEE International Electron Devices Meeting, 2010, Dec. 6-8, 2010, pp. 13.5.1-13.5.4.

Konstantinov, Andrei, "Enhancement of Current Gain in SiC BJTs using Gallium Doping", Fairchild Semiconductor, Oct. 8, 2013, 8 pages.

Saito et al., "Effects of Gallium Doping on the Properties of Amorphous SiC:H Films Prepared by Magnetron Cosputtering", J. Appl. Phys. 83, 2067, 1998.

Vodakov et al., "Silicon Carbide Doped With Gallium", Article first published online Feb. 16, 2006, physica status solidi (a), vol. 35, Issue 1, pp. 37-42.

* cited by examiner

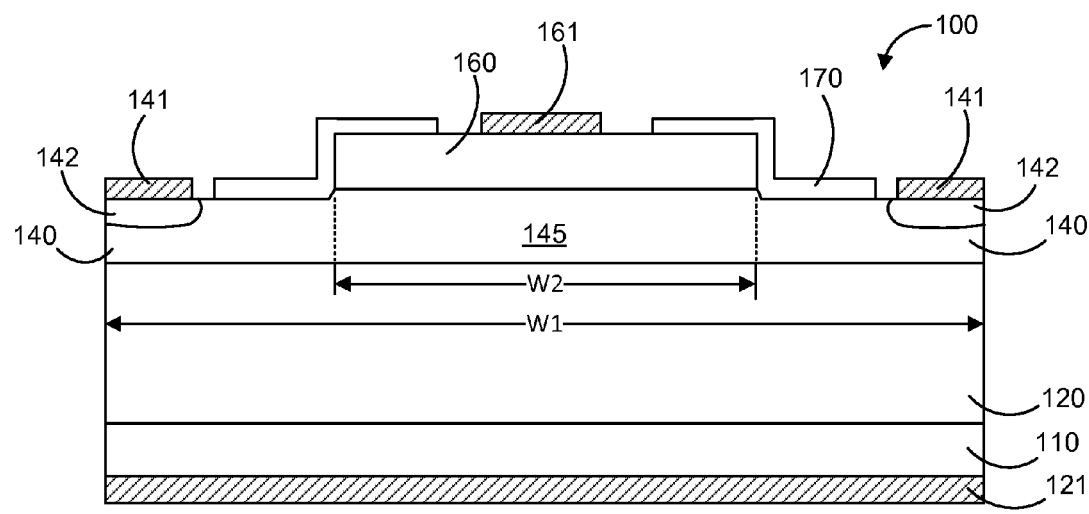
FIG. 1
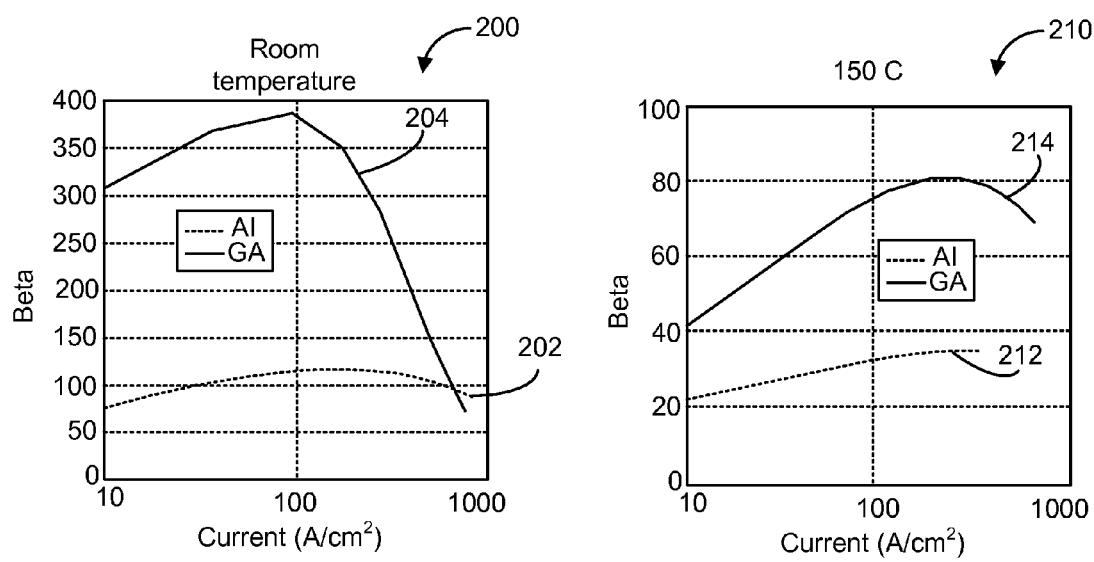
FIG. 2A
FIG. 2B

SILICON CARBIDE POWER BIPOLAR DEVICES WITH DEEP ACCEPTOR DOPING

RELATED APPLICATIONS

This application is a non-provisional of, and claims priority to, U.S. Provisional Application No. 62/032,935, entitled "Silicon Carbide Power Bipolar Devices with Deep Acceptor Doping", filed Aug. 4, 2014, which is hereby incorporated by reference in its entirety.

TECHNICAL FIELD

This disclosure is related to high power semiconductor device technology and, in particular, to high power silicon carbide bipolar power devices. The present disclosure also relates to methods of manufacturing such silicon carbide power devices.

BACKGROUND

Silicon carbide (SiC) bipolar junction transistors (BJTs) and other bipolar devices are high-performance power devices having low on-state and switching losses and are also capable of high-temperature operation due, in part, to the high breakdown electric field, high thermal conductivity and high saturated drift velocity of electrons in SiC. SiC is a wide bandgap semiconductor and, therefore, may advantageously be used for manufacturing devices (such as bipolar devices) for high power, high temperature and high frequency applications.

High-power bipolar junction transistors (BJTs) (including a collector region, a base region and an emitter region) can be used as standalone devices in high-power applications, or can be incorporated in other high-power bipolar semiconductor devices, such as insulated-gate bipolar transistors, thyristors, and so forth. One of the critical characteristics representative of the performance of a high-power BJT (a BJT power device) are common emitter current gain (which may be referred to as ECG or beta). A BJT with a low ECG may consume too high a drive current. An IGBT with a low ECG of the built-in bipolar transistor may have too high of a forward voltage drop. The same concerns also apply for thyristor devices.

When designing high-power BJTs (and devices including the elements of a BJT, such as IGBTs and thyristors), making tradeoffs between performance parameters is typically required. For instance, improvements in ECG (beta) can be achieved by reducing acceptor dose (dopant dose) in the base region of a NPN BJT transistor. However, reducing the acceptor dose in the base region also reduces the blocking (breakdown) voltage of the BJT. Therefore, improvements in ECG can also result in a degraded blocking voltage for a given BJT. Similar design tradeoffs exist for other bipolar power devices, such as those that include the elements of a BJT (e.g., IGBTs and thyristors).

In BJTs, or other bipolar devices, a high value of ECG can be achieved with easy means by decreasing the total acceptor charge in the base. However, in a high power BJT such technique will come at the cost of a high drop in breakdown voltage from the theoretical due to early punch-through of the base region.

SUMMARY

In a general aspect, a power semiconductor device can include a collector region disposed on a substrate, the collector region can include n-type silicon carbide (SiC). The power semiconductor device can also include a base region disposed on the collector region. The base region can include p-type SiC doped with gallium. The power semiconductor device can include an emitter region disposed on the base region. The emitter region can include n-type SiC carbide.

Example implementations can include one or more of the following features. For instance, the power semiconductor device can be one of a bipolar junction transistor (BJT), an insulated-gate bipolar transistor (IGBT) and a thyristor.

The power semiconductor device can include an Ohmic contact. The Ohmic contact can include a sub-contact region disposed in the base region and laterally spaced from the emitter region. The sub-contact region can be doped with aluminum. The Ohmic contact can include a base terminal contact disposed on the sub-contact region.

The collector region, the base region and the emitter region can be arranged as a vertical stack. The emitter region can be an elevated structure on the stack that is defined by a first sidewall and a second sidewall of the emitter region. An interface between the emitter region and the base region can define an intrinsic base region of the power semiconductor device. In other words, a portion of the base that is vertically disposed (e.g., between the first and second sidewalls) between the emitter region and the collector region can be referred to as the intrinsic base region. The intrinsic base region can include a first portion having a width that is narrower than a width of the emitter region and at least one second portion that is adjacent to the first portion, where the first portion can be thinner than the second portion. The first portion of the intrinsic base region can be substantially centered between the first sidewall and the second sidewall of the emitter region. A portion of the base that is laterally spaced from the emitter region can be referred to as the extrinsic base region.

The power semiconductor device can include a dielectric layer disposed on at least a portion of an upper surface of the emitter region, the first sidewall of the emitter region and a portion of the base region that is adjacent the first sidewall of the emitter region. The portion of the base region adjacent the first sidewall of the emitter region can be a first portion, and the dielectric layer can be disposed on the second sidewall of the emitter region and a second portion of the base region adjacent the second sidewall of the emitter region.

The p-type SiC of the base region can be further doped with aluminum. The p-type SiC of the base region can be a first base region layer, and the power semiconductor device can include a second base region layer disposed on the first base region layer. The second base region layer can include p-type SiC doped with aluminum. A dopant dose of aluminum in the second base region layer can be higher than a dopant dose of gallium in the first base region layer.

The p-type SiC of the base region can be a first base region layer, and the power semiconductor device can include a second base region layer disposed on the first base region layer. The second base region layer can include p-type SiC doped with aluminum. The power semiconductor device can include a third base region layer disposed on the second base region layer. The third base region layer can include p-type SiC doped with gallium.

The collector region can define an n-type cathode of a thyristor. The base region can define a p-type base region of the thyristor. The emitter region can define an n-type base region of the thyristor. The power semiconductor device can include a p-type anode disposed on the n-type region. The power semiconductor device can include a p-type depletion stopper region disposed between the n-type cathode and the p-type base region. The thyristor can be a punch-through thyristor. The thyristor can be a non-punch-through thyristor.

The power semiconductor device can be an insulated-gate bipolar transistor (IGBT). The base region can include a p-type field-stop region of the IGBT. The power semiconductor device can include a p-type drift region disposed between the p-type field stop region and the emitter region and a field effect transistor (FET). The FET can include a source region operationally coupled with the emitter region, a drain region operationally coupled with the base region and a gate terminal configured to control current flow between the source region and the drain region.

The base region can include an intrinsic base region and an extrinsic base region. The intrinsic base region can have a Ga doping concentration that is more than fifty percent of a total acceptor doping concentration of the intrinsic base region. At least a portion of the extrinsic base region can have an aluminum (Al) doping concentration that is more than fifty percent of a total acceptor doping concentration of the extrinsic base region.

In another general aspect, a power bipolar junction transistor (BJT) can include a substrate including n-type silicon carbide (SiC); a buffer layer including n-type SiC; a collector region disposed on the buffer layer, the collector region including n-type SiC; a base region; and an emitter region including n-type SiC. The base region can include a first base layer disposed on the collector region, the first base layer including gallium doped p-type SiC; and a second base layer disposed on the first base layer, the second base layer including aluminum doped p-type SiC, the second base layer having a resistivity that is lower than a resistivity of the first base layer. The base region can have a recess defined therein. The recess can extend through the second base layer to the first base layer. The emitter region can have a first portion disposed in the recess and directly on the first base layer and a second portion disposed directly on the second base layer.

Example implementations can include one or more of the following features. For instance, the power BJT can include a base terminal contact disposed on the second base layer, an interface between the base terminal contact and the second base layer defining an Ohmic contact, and an emitter terminal contact disposed on the emitter region.

The power BJT can include a dielectric layer disposed on at least a portion of an upper surface of the emitter region, a sidewall of the emitter region and a portion of the second base layer that is adjacent the sidewall of the emitter region In another general aspect, a power bipolar junction transistor (BJT) can include a substrate including n-type silicon carbide (SiC); a collector region disposed on the substrate, the collector region including n-type SiC; a base region disposed on the collector region, the base region including gallium doped p-type SiC; and an emitter region disposed on the base region, the emitter region having a width that is narrower than a width of the base region. The power BJT can include a sub-contact region disposed in the base region and laterally disposed from the emitter region and a base terminal contact disposed on the sub-contact region.

Example implementations can include one or more of the following features. For instance, the gallium doped SiC of the base region can be further doped with aluminum. The gallium doped SiC of the base region can a first base layer. The base region can include a second base layer disposed on the first base layer. The second base layer can include aluminum doped p-type SiC. The base region can include a third base layer disposed on the second base layer. The third base layer can include gallium doped p-type SiC.

The gallium doped SiC of the base region can be a first base layer. The base region can include a second base layer disposed between the collector region and the first base layer. The second base layer can include aluminum doped p-type SiC.

The power BJT can include a dielectric layer disposed on at least a portion of an upper surface of the emitter region, a sidewall of the emitter region and a portion of the base region adjacent the sidewall of the emitter region.

In another general aspect, a thyristor can include a cathode region including n-type silicon carbide (SiC); a depletion stopper layer disposed on the including gallium doped p-type SiC; a p-type base region disposed on the depletion stopper layer, the p-type base region including p-type SiC; an n-type base region disposed on the p-type base region, the n-type base region including n-type SiC; and an anode region disposed on the n-type base region, the anode region having a width that is narrower than a width of the n-type base region, the anode region including p-type SiC.

Example implementations can include one or more of the following features. For instance, the thyristor can include an Ohmic contact. The Ohmic contact can include a sub-contact region disposed in the n-type base region and laterally spaced from the anode region, where the sub-contact region can include an n+ ion implantation region. The Ohmic contact can include a base terminal contact disposed on the sub-contact region.

The p-type base region can be doped with at least one of aluminum and gallium. The anode region can be doped with aluminum.

In another general aspect, a thyristor can include a cathode region including n-type silicon carbide (SiC); a p-type base region disposed on the cathode region, the p-type base region including gallium doped p-type SiC; an n-type base region disposed on the p-type base region, the n-type base region including n-type SiC; and an anode region disposed on the n-type base region, the anode region having a width that is narrower than a width of the n-type base region, the anode region including aluminum doped p-type SiC. The p-type base region can be further doped with aluminum.

In another general aspect, a method of forming a power semiconductor device can include forming a collector region on a substrate, the collector region including n-type silicon carbide (SiC); forming a base region on the collector region, the base region including p-type SiC doped with gallium; and forming an emitter region on the base region, the emitter region including n-type SiC carbide.

Example implementations can include one or more of the following features. For instance, the collector region can define a cathode of a thyristor; the base region can define a p-type base region of the thyristor, and the emitter region can define an n-type base region of the thyristor. The method can include forming an anode of the thyristor on the n-type base region. The base region can be further doped with aluminum.

The method can include forming an Ohmic contact. Forming the Ohmic contact can include forming a sub-contact region in the base region and laterally spaced from the emitter region, the sub-contact region being doped with aluminum and forming a base terminal contact on the sub-contact region. Forming the sub-contact region can include implanting aluminum in the base region and annealing the power semiconductor device. Forming the sub-contact region can includes defining a recess in the base region and epitaxial growing aluminum doped SiC in the recess.

Forming the emitter region can include defining a recess in the base region and epitaxially growing the emitter region in the recess and on at least a portion of an upper surface of the base region.

The method can include forming a dielectric layer disposed on at least a portion of an upper surface of the emitter region, a sidewall of the emitter region and a portion of the base region adjacent the sidewall of the emitter region.

BRIEF DESCRIPTION OF THE DRAWINGS

FIG. 1 is a cross-sectional view of a bipolar junction transistor (BJT).

FIGS. 2A-2C are graphs illustrating performance characteristics for various BJTs.

Like reference symbols in the various drawings indicate like and/or similar elements.

DETAILED DESCRIPTION

Figure 2C:
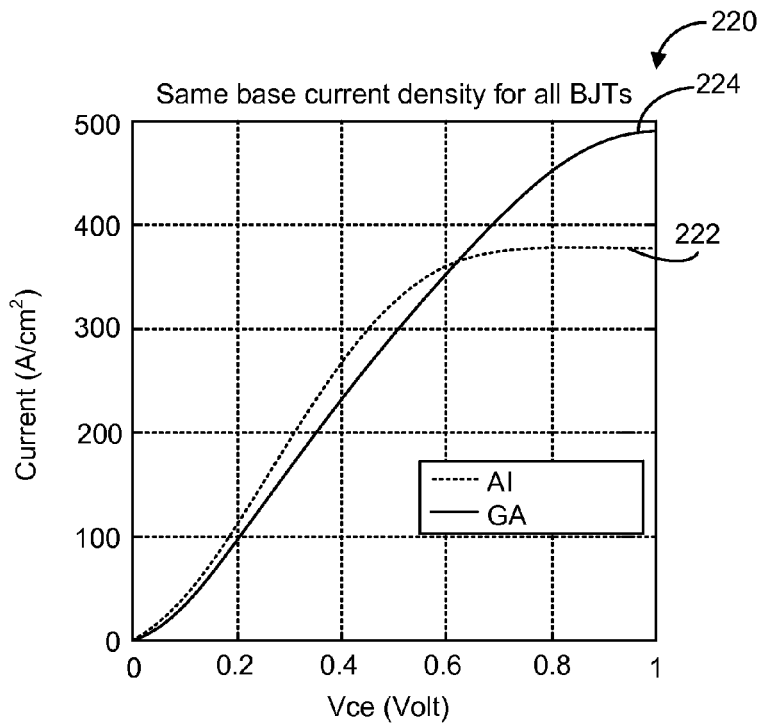

Semiconductor devices used in high-power applications (which may be referred to as high-power devices, power devices, and so forth), whether manufactured using silicon carbide (SiC), such as 4H SiC or 6H SiC), silicon, silicon germanium, or other materials, should operate so as to rectify and/or switch a high electric power, such as approximately 400 V (or more) with approximately 4 A of current (or more), but still have reasonably small dimensions, so as to be economic to manufacture. Such bipolar power devices may include bipolar junction transistors (BJTs), insulated gate bipolar transistors (IGBTs), thyristors (punch-through and non-punch-through), rectifying diodes, etc.

Performance parameters for a given device are determined, at least in part, by material constants for the device. One measure of performance for a particular device in order to determine suitability of a device for use in power (high-power) applications can be assessed by determining a ratio of the specific on-state resistance (measured) of the device to the calculated (theoretical) resistance of an ideal majority-carrier device (e.g., a non-punch-through (NPT) diode) that is capable of blocking the same voltage. For instance, the ideal (theoretical) specific on-state resistance $R_{ON}$ (in Ohms*cm$^2$) for a SiC (e.g., 4H SiC) NPT diode can be determined using Eq. 1 below:

$$R_{ON} = 4V_B^2 / \epsilon \epsilon_o \mu E_c^3 \qquad \text{(Eq. 1)}$$

where $V_B$ is the theoretical breakdown voltage, $\epsilon_o$ is the dielectric constant, $\epsilon$ is the permittivity of SiC, $\mu$ is the majority carrier mobility (around 800 cm$^2$/Vs for electrons in SiC), $E_C$ is the critical field for avalanche breakdown (approximately 2.3 MV/cm in 4H SiC). Theoretical breakdown voltages are known for SiC materials. The use of materials having a high critical field is, therefore, important to help, for example, reduce conduction losses.

Physical bipolar power device implementations generally have higher on-state resistance than the theoretical specific on-state resistance given by Eq. 1. A bipolar device with excessive $R_{ON}$ may consume more area (e.g., chip area) than desirable, and also may operate (e.g., switch) too slowly for use in a number of high power applications. If operation of a given power device is too slow, the given device might be not useful as an efficient replacement of conventional silicon devices. Accordingly, it may be desirable to provide (e.g., produce) high power SiC devices, such as those described herein, having specific on-state resistances that are less than approximately 10 times the minimum theoretical $R_{ON}$ value, as defined by Eq. 1.

According to a general aspect, at least the intrinsic base of a silicon carbide high-power NPN BJT is predominantly doped with gallium (Ga). FIG. 1 is a cross-sectional drawing illustrating a unit cell of a power NPN BJT (BJT) 100 according to this general aspect. Such a silicon carbide high-power BJT (and other Ga doped bipolar devices) can achieve increased current gain while retaining near-theoretical blocking voltage and on-state resistance.

As illustrated in FIG. 1, the BJT 100 includes a substrate 110 on which a collector region (layer) 120, a base region (layer) 140, having a width W1, and an emitter region (layer) 160, having a width W2, have been epitaxially grown. In the case of a NPN SiC BJT, the epitaxial structure of the BJT 100 may include an n-type SiC collector layer 120 that is epitaxially grown on top of a highly doped n-type SiC substrate 110. The BJT 100 further includes an n-type buffer layer 130 between the substrate 110 and the collector 120. The BJT 100 still further includes a SiC p-type base layer 140 that is epitaxially grown on the collector layer 120 and a highly doped n-type SiC emitter layer 160 that is epitaxially grown on the base layer 140. The BJT 100 (e.g., BJT unit cell) further includes a mesa structure, having an emitter layer 160 that may be defined by etching. The etching may expose the surface of p-type base layer 140 in at least a portion of the unit cell. The portion of the base layer 140 outside the emitter mesa region may be referred to as an extrinsic base region 146, while the portion of the base disposed below the emitter 160 may be referred to as an intrinsic base region 145.

An elevated level of acceptor doping can be applied to sub-contact portions 142 of the extrinsic base 146, so as to reduce base contact resistance as well as the extrinsic base resistance. This is acceptor doping in the sub-contact regions 142 can be achieved through ion implantation, with a subsequent high-temperature anneal, so as to at least partially remove implantation damage and to activate the implanted acceptors in the sub-contact regions 142. A passivation dielectric 170 can be formed on the sidewalls of the emitter (mesa) 160, adjacent the sidewalls and/or on at least a portion of an upper surface of the emitter 160. Ohmic contacts may be formed on the emitter (Ohmic contact 161), to the base (Ohmic contacts 141) and to the back side of the substrate (Ohmic contact 121).

In current approaches, aluminum (Al) is used as an acceptor dopant in NPN SiC BJTs. In these implementations, the Al dopant in SiC has the lowest ionization energy of known acceptors dopant species. Therefore, Al doping may provide higher sheet conductivity for a given acceptor dose as compared to other known acceptor dopant species. Such higher sheet conductivity can be beneficial, as it can mitigate certain undesirable effects, such as the so-called emitter edge effect. However, a disadvantage of devices produced with Al acceptor doping is that they may have ECG that is too low for acceptable operation in power device application. In devices produced in accordance with the above discussed general aspect, the epitaxial p-type base layer (e.g., intrinsic base) can be doped with gallium (Ga) instead of Al, which can achieve increases in ECG for a given device design due to the higher ionization energy of Ga. In such devices it may, however, be preferable that acceptor doping in the p-type sub-contact regions (base contacts) be done with only, or predominantly with, Al, in order to achieve a lower contact resistance.

FIGS. 2A-2C are graphs illustrating comparisons of simulation results for SiC (4H SiC) BJT devices having base regions doped with Al acceptors and SiC BJT devices having base regions doped with Ga acceptors, where the physical dimensions of the devices, unless otherwise indicated, are substantially the same. FIGS. 2A and 2B are graphs illustrating a comparison of simulation results for a 1200 V SiC BJT design (such as with the structure of the BJT 100 of FIG. 1) for a first SiC BJT having an Al-doped base region and a second SiC BJT having a Ga-doped base region. For purposes of illustration, FIGS. 2A and 2B, as well as FIG. 2C, will be described with further reference to FIG. 1, though the approaches described herein can be implemented in any number of bipolar power devices implemented, for example, in SiC.

For the BJTs corresponding with the graphs 200 and 210 of FIGS. 2A and 2B, the following simulation parameters were used. For instance, the total pitch (overall width of a unit cell) of the BJTs was 40 μm, the width of the emitter region 160 was 20 μm, the base region 140 was 0.6 μm thick and doped with acceptor dose (for both Al and Ga) of 4e17 cm$^{-2}$. Further, in the simulated devices corresponding with FIGS. 2A and 2B, the collector region 120 was 10 μm thick and doped with a donor dose of 8e15 cm$^{-2}$, while the emitter region 160 was 1 μm thick and doped with a donor dose of 1e19 cm$^{-2}$. The graph 200 of FIG. 2A illustrates a comparison of ECG for the BJTs at room temperature (e.g., approximately 25° C.), while the graph 210 of FIG. 2B illustrates a comparison of ECG for the BJTs at 150° C.

As shown in FIGS. 2A and 2B, ECG (beta) for the BJT with the Ga-doped base region 140 is much higher than ECG (beta) for the BJT with the Al-doped base region 140, particularly at lower device current densities. Also, as illustrated in FIGS. 2A and 2B, the peak ECG for the BJT with the Ga-doped base region 140 occurs at a lower current density than the peak ECG for the BJT with the Al-doped BJT base region 140.

FIG. 2C is graph that illustrates a comparison of simulation results for the output characteristics for a first BJT having Al doping in the base region and a second BJT having Ga doping in the base region. The comparison in FIG. 2C is shown with the two BJTs at the same base current density. The BJTs of FIG. 2C, as well as the simulation model parameters are identical (substantially identical) apart from the difference in the type of acceptor impurity (e.g., Al as compared with Ga). For the simulation results for the BJTs of FIG. 2C, the emitter and base stripe widths are both 20 μm in this particular example. The curve 222 in FIG. 2C corresponds to the BJT with Al base doping, while the curve 224 corresponds to the BJT with Ga base doping. As shown in FIG. 2C, the on-state resistance of Ga-doped BJT is slightly higher than that for the Al doping, where the on-state resistances are determined by the slopes of the respective curves 222 and 224.

The simulation results (e.g., 2-D simulation results) shown in FIGS. 2A-2C can be qualitatively explained as follows. The maximum ECG of a BJT is limited by the ratio of effective Gummel numbers K, K=$Q_{Eeff}/Q_{Beff}$, where $Q_{Eeff}$ is the effective Gummel for the emitter, and $Q_{Beff}$ is the effective Gummel number for the base. For a medium-level doped non-degenerate material, the effective Gummel number is close to (approximately equal to) the total dose of acceptors (or donors) in a respective region. For instance, for a base region, $Q_{Beff}=Q_B*f_I$, where $Q_B$ is the total dose of acceptors in the base region and $f_I$ is the extent of ionization (e.g., percentage of ionized acceptor dopant). An increase of ionization energy level as a result of using Ga acceptors in place of, at least a portion of, Al acceptors results in a lower extent of acceptor ionization (lower ionization extent). This lower ionization extent results in a corresponding increase in ECG. The use of Ga acceptors can also result in higher base resistance and also in a more pronounced emitter edge effect in such Ga-doped SiC BJTs as compared to Al-doped BJTs.

As discussed herein, the lower extent of acceptor level ionization $f_I$ (For Ga acceptors) results in improvement of current gain of Ga-doped BJT as compared to that with Al doping, which can be seen in the curves plotted in FIGS. 2A, 2B and 2C. As noted above, increased base resistance of Ga-doped BJTs can result in a more pronounced emitter edge effect, which is demonstrated by the fact that ECG for Ga-doped BJTs peaks at a lower current density than for corresponding Al-doped BJTs. Increased current crowding at the emitter edge of a Ga-doped BJT is also demonstrated by a slight increase of the on-state resistance of the BJT in the linear (saturation) mode, as is illustrated by the curves 222 and 224 in FIG. 2C. Further, avalanche breakdown voltage and punch-through voltage of Ga-doped and Al-doped BJTs are substantially identical as long as the total acceptor dose remains approximately equal for a given BJT design (physical structure).

The simulation results of FIGS. 2A-2C do not show pronounced effects of the implanted sub-contact region on the output characteristics of the BJT as long as specific contact resistance remains a relatively low value. However, fabrication of contacts having a low specific contact resistance to p-type SiC can be complicated. In order to achieve a low specific contact resistance in a SiC BJT, the sub-contact region (such as described herein) can be provided with additional acceptor doping. In certain implementations, selective doping of SiC with ion implantation can be performed. Because the solubility of Ga in SiC is lower than that of Al, it may be preferable to use Al as a doping impurity for sub-contact p-type implants in SiC devices. Further, the higher ion mass of Ga could also result in higher ion damage if Ga ions are implanted instead of Al. Such additional ion damage is undesirable, because damage to the SiC crystalline structure resulting from the ion implantation (e.g., Ga ion implantation) damage may not be fully removed by an activation anneal at practically achievable anneal temperatures, where the activation anneal is performed subsequent to the ion implantation in the sub-contact region. A lower resistance in Al-doped portions 142, as compared with Ga doping, will also contribute to a decrease of the total base resistance of the base region (intrinsic and extrinsic).

Therefore, in some implementation, at least some portions of the extrinsic base region can be predominantly doped with Al acceptors (e.g., Al acceptors represent more than 50% of the total acceptor species doping concentration). In implementations where the sub-contact region 142 is ion implanted, the implant can be performed using Al ions. If co-implantation of Ga ions and Al ions is use, the dose of implanted Al should exceed the dose of implanted Ga. For example, Al ions may represent more than 50%, more than 60%, more than 70%, more than 80% or more than 90% of the total doping concentration of Al and Ga combined.

In some implementations, the epitaxial base layer may be co-doped with Ga ions and Al ions. Such co-doping can achieve improvements in ECG of a given device, while also achieving a lower base resistance than the base resistance that can be achieved in the given device if the base is doped using only Ga acceptors. Such co-doping of an intrinsic base region of a SiC BJT with Ga and Al may, for example, be used to improve performance of high-frequency BJTs, for which it is important to obtain an RC time constant of the base region (resistance times capacitance) with a relatively low value.

Figure 3:
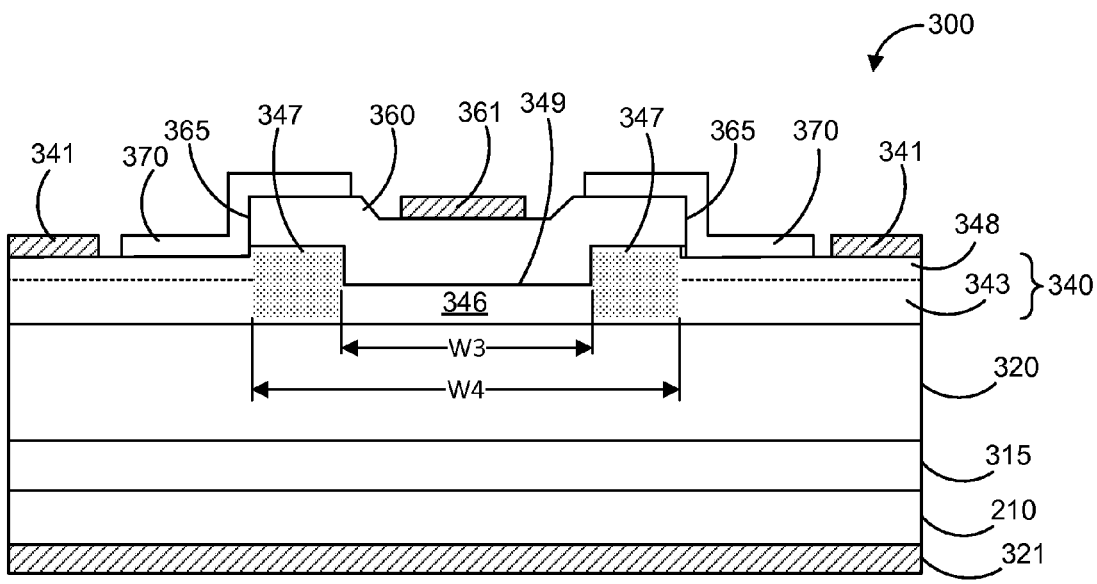
FIG. 3 is a cross-sectional view of a BJT including an overgrown emitter.

FIG. 3 is a cross-sectional diagram that illustrates a SiC BJT 300. As shown in FIG. 3, the BJT 300 includes a substrate 310 on which a n-type buffer layer 315, a collector region 320, a base region 340 and an emitter region 360 are arranged as a stack. The SiC BJT 300 may be a NPN BJT such as the BJT 100 described above with reference to FIG. 1. An Ohmic (collector) contact 321 can be formed on the bottom side of the substrate 310.

In the BJT 300, the emitter region 360 can be epitaxially overgrown on top of a recess (well) 349 that is etched in the (p-type) base region 340. The recess 349 in the base region 340 can be defined by removing a portion of the base region 340 to form a first portion 346 of the base region 340 with a decreased thickness, where the first portion 346, having a width W3, defines an active portion of the intrinsic base region 345 in the base layer 340. The emitter region 360, having a width W4, can be deposited (epitaxially grown) on top of the patterned base region 340 using, for example, chemical vapor deposition (CVD). As a result of such epitaxial growth, the emitter region 340 can cover the bottom of (substantially fill) the recess 349 defined in the base layer 340 and the remaining part of the base layer with a rather homogenous thickness. The emitter region 360 can then be defined (using a combination of e.g. photolithography and dry etching techniques) such that the edges of the first portion 346 of the intrinsic base region 345 do not coincide with the outer sidewalls 365 of the emitter region 360. In other words, a second portion or spacing region 347 can be formed between the edges of the first portion 346 of the intrinsic base region 345 and the outer sidewalls 365 of the emitter region 360, such as depicted in FIG. 3.

In the BJT 300, the base region 340 may include two or more layers. For instance, as illustrated in FIG. 3, the base region 340 can include a first layer 343 that includes a Ga-doped SiC layer, which is epitaxially grown (e.g. by CVD) on top of the collector layer 320. The base region 340 may further include a second layer 348 that includes an Al-doped SiC layer, which is epitaxially grown (e.g. by CVD) on top of the first layer 343. The second layer 348 may then be etched in an area corresponding to the recess 349 that corresponds with the first portion 346 of the intrinsic base region 345 that is to be formed on the base layer 340. Defining the recess 349 may include one or more photolithography and etch processes. The second (Al-doped) SiC layer 348 may also be referred to as the base capping layer. In such an arrangement, the first (Ga-doped) base region layer 343 may provide the acceptor operation of the BJT 300, while the second (Al-doped) base region layer 348 may reduce the overall base resistance of the base region 340, so as to overcome (or reduce) the issues associated with increase base resistance in an NPN BJT as discussed above.

The depth of the recess 349 may be substantially equivalent to (or slightly greater than) a thickness of the second (Al-doped) base region layer 348. In other words, defining the recess 349 may be include completely removing the second base region layer 348 in the first portion 346 of the intrinsic base region of the BJT 300. Said differently, an etch depth for defining the recess 349 may be adjusted to completely remove the second base region layer 348 in the area of the first portion 346, such that the first portion 346 includes only material of the first (Ga-doped) base region layer 343. In certain implementations, the second (Al-doped) base region layer 348 may have an acceptor concentration that is higher than the acceptor concentration of the first (Ga-doped) base region layer 343 to provide additional reductions in overall base resistance. The thickness (via the etch depth) of the first portion 346 of the base region 340 and the doping concentration of the first (Ga-doped) base region layer 343 can be selected in accordance with a desired blocking voltage and a desired ECG for the SiC BJT 300. The depth of the recess 349 can therefore, for some implementations, be adjusted to remove a certain thickness of the second (Al-doped) base region layer 348. Further, the higher Al acceptor concentration in the second base region layer 348 can function as a sub-contact region to facilitate the formation of low-resistance Ohmic contacts 341 to the base layer 340 and, thus, further decreases the overall base resistance. The base region 340 of the BJT 300 could also be formed using techniques described herein, such as those described below with respect to FIG. 4, for example.

Because FIG. 3 illustrates a cross-sectional view of the SiC BJT 300, only two outer sidewalls 365 of the emitter region 360 are shown. In a BJT, such as the BJT 300, an emitter stripe used to form the emitter region 360 has finite dimensions and, thus, additional charge provided at the edges of the intrinsic base region 345 (under the outer sidewalls 365 of the emitter region 360) via the second portion 347 can be provided at any one of the other edges of the intrinsic base region (and outer sidewalls 365 of the emitter region 360). The first portion 346 of the intrinsic base region 345 having the lowest acceptor charge is advantageously spaced away from any of the outer sidewalls 365 of the emitter region 360. This configuration can suppress the undesired effect of surface recombination, which can cause a reduction in ECG of a corresponding device.

Figure 4:
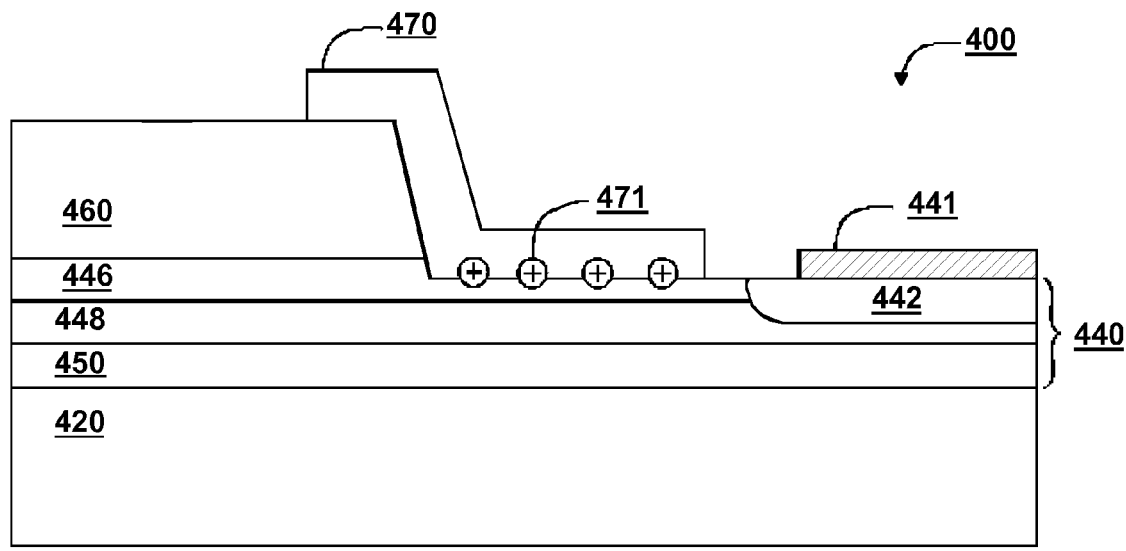
FIG. 4 is a cross-sectional view of a BJT with multiple base layers.

FIG. 4 is a cross-sectional view that illustrates a BJT 400 with a multi-layer base region according to a further embodiment. As noted above, one approach to compensate for the effects of increased base resistance in SiC BJTs that have a Ga-doped base region is to implement a co-doped base region. FIG. 4 illustrates an implementation of a multi-layer, co-doped base region 440 that is disposed on a collector region 420. In the BJT 400, the base region 440 includes a first base region layer 446, a second base region layer 448 and a third base region layer 450. In certain implementations, the base region 440 can include fewer or additional base region layers. The BJT 400 also includes an emitter region 460, an Ohmic contact 441 and a p-type (Al doped) sub-contact region 442, such as have been described herein. The BJT 400 may also be capped with a dielectric, such as the dielectric layer 170 in FIG. 1, to reduce and/or suppress surface recombination of minority characters.

In the BJT 400, the base layers 446, 448, 450 can each be doped with Ga acceptors, Al acceptors or a combination of Ga acceptors and Al acceptors. In an example implementation of the BJT 400, Ga acceptors may be used in the base region layers that are depleted during operation of the BJT 400, i.e., the base region layers 446 and 450, while Al acceptors are used in the central base region layer 448. In such a configuration, the Al-doped base region layer 448 may reduce overall base resistance (as compared to a base region doped only with Ga), while the Ga-doped in the base region layer 446 can provide the acceptor charge and corresponding benefits of Ga doping that are discussed herein. The Ga-doped base region layer 450 can provide off-state voltage blocking without substantially increasing the effective Gummel number for the base region, QBeff. The use of Ga doping in layer 446 is beneficial because of inevitable depletion of this layer by the interface charges 471 at an interface of the base layer 446 to a dielectric layer 470 (e.g., an interface between the base layer 446 and the dielectric layer 470).

As noted above, a combination of Al and Ga doping (co-doping) in a single base layer can also be used to reduce the on-state resistance of given BJT design. This can be done by epitaxially growing a co-doped SiC that is doped with both Al acceptors and Ga acceptors. The ratio of acceptor doses (and the specific dose for each acceptor type) will depend on the specific implementation. For instance, the ratio of Al acceptor dose to Ga acceptor dose in such a co-doped single base layer may be 1:1, 2:1, 1:2, 3:1, 1:3, and so forth. Acceptor doping profiles may be graded, rather than stepwise in variation, at the interfaces of layers 446 to 448 and of layers 448 to 450.

Figure 5:
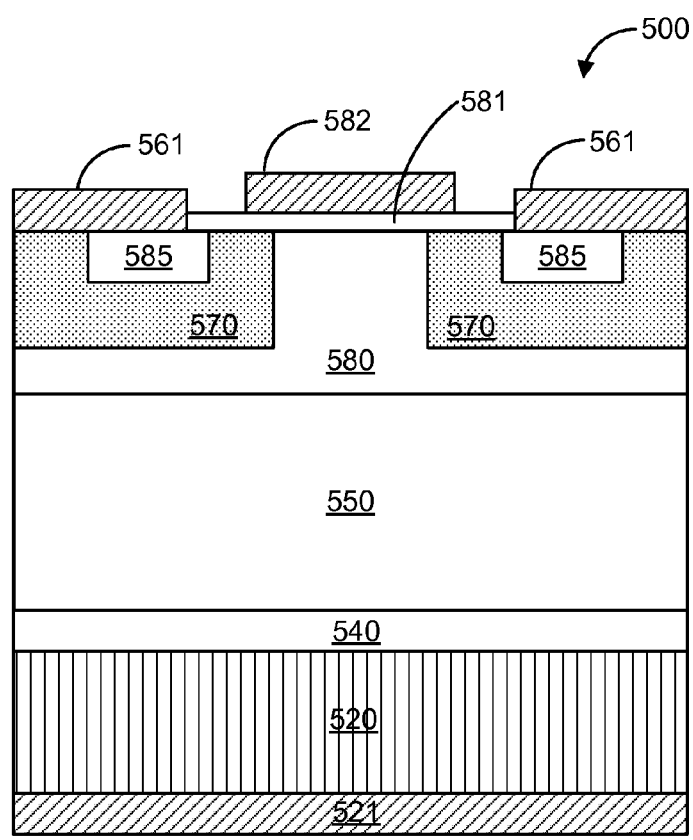
FIG. 5 is a cross-sectional view of an insulated-gate bipolar transistor (IGBT).

FIG. 5 is a cross-sectional diagram that illustrates a SiC IGBT 500, in accordance with an implementation. In the SiC IGBT 500, Ga doping may be used in a low-doped base and in a field-stop later. As shown in FIG. 5, an epitaxial structure of the IGBT 500 can include an n-type cathode layer 520, a p-type depletion stopper (field-stop) layer 540, a p-base layer 550 and a current-spreading layer 580 (one or more of which could be omitted in other implementations). The p-type depletion stopper layer 540 can be at least partially doped with Ga acceptors. The current-spreading layer 580 can be predominantly doped with Al acceptors. The IGBT 500 can further include ion-implanted n-type body regions 570 and Al-doped ion-implanted p-type anode regions 585. A channel dielectric (e.g., metal-oxide-semiconductor (MOS) gate dielectric) 581 can be formed on a top (wafer) surface, and a gate electrode 582 can be formed on top of (disposed on) the channel (gate) dielectric 581. Anode contacts 561 can be defined in windows (e.g., defined by one or more etch processes) in the gate dielectric 561. The anode contacts 561 can also define Ohmic contacts to the n-type body regions 570. Further, an Ohmic contact 521 can also be defined (e.g., disposed) on the cathode region 520.

The p-type depletion stopper layer 540 can be much thinner than the p-type base region 550 and have an acceptor dose above at least $1.5 \times 10^{13}$ cm$^{-2}$ so as to terminate an electric field exceeding $E_c$. The doping of the thick base region 550 can be in a range below $1 \times 10^{15}$ cm$^{-3}$' so as to keep a total acceptor dose in the p-type depletion stopper layer 540 below $10^{13}$ cm$^{-2}$. An idealized IGBT having a thin depletion stopper layer has a near-rectangular electric field profile in the off-state. An IGBT with uniform doping of the thick base region will have a triangular electric field profile. Because the maximum electric field can be limited by the critical field $E_c$, it is possible, in some implementations, to block almost two times higher voltage with the depletion stopper (or punch-though, PT) design shown in FIG. 5, as compared to IGBTs having uniform doping of their base regions. In other PT IGBT implementations, the blocking voltage may be higher or lower than almost two times that of an IGBT having uniform doping of its base region.

The IGBT 500 shown in FIG. 5 and described above can be turned on by applying a negative bias to the gate 580, which forms a p-channel at an interface of the n-type bod region 580 to the channel dielectric 581. The use of Ga doping instead of Ga in the p-type depletion stopper layer (region) 540 can increase injection efficiency from the cathode region 520 into the base 550, which can decrease the on-state voltage. It may be an advantage, in some implementations, to use Ga for doping of the base region 550, or, in other implementations, to use co-doping with Ga and Al for the base region 550.

Figure 6:
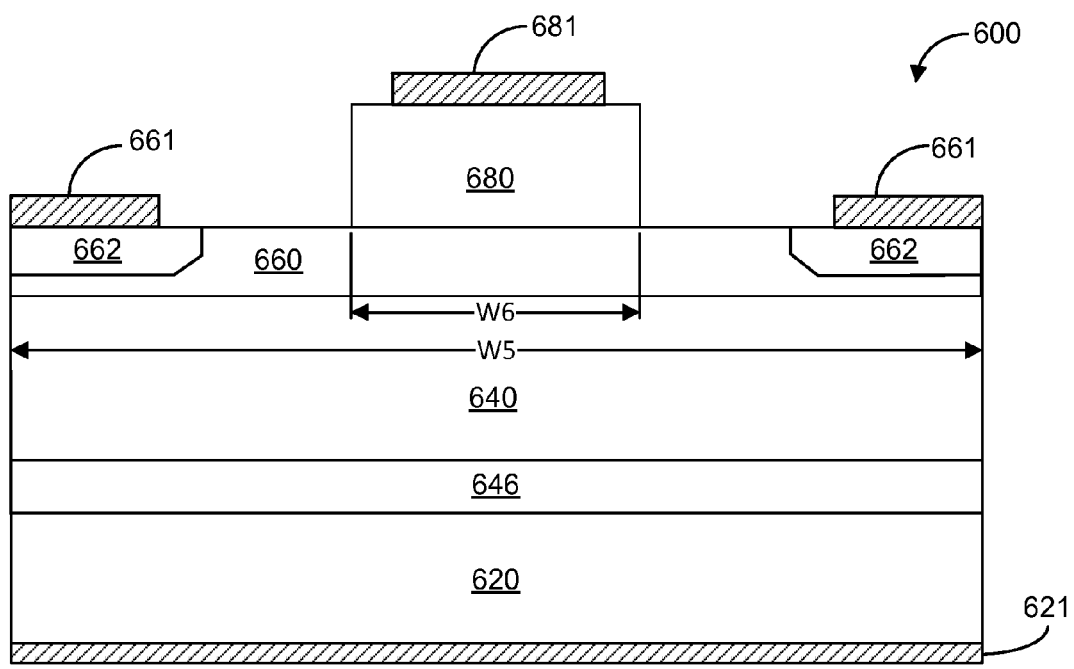
FIG. 6 is a cross-sectional view of a punch-through (PT) thyristor.

FIG. 6 is a cross-sectional diagram illustrating a punch-through (PT) thyristor 600 that may be implemented in SiC using Ga doping, such as described herein. The PT thyristor 600 includes an n-type SiC cathode 620. An Ohmic contact 621 can be formed on the cathode 620. The thyristor 600 further includes a p-type depletion stopper layer 646 that is disposed on the cathode 620 and a p-type base region 640 that is disposed on the p-type depletion stopper layer. The thyristor 600 shown in FIG. 6 also includes an n-type base region 660, having a width W5, disposed on the p-type base region 640 and a p-type anode 680, having a width W6, disposed on the n-type base region 660. Further, the thyristor 600 includes Ohmic contacts 661 to the n-type base region 660 that are disposed on n+ implant regions 662, which are disposed in the n-type base region 660.

In the thyristor 600, the p-type base region 640 may be a relatively thick base region with a low doping. The depletion stopper layer 646 can be much thinner than the thick p-type base region 640 and can have an acceptor dose above at least $1.5 \times 10^{13}$ cm$^{-2}$ so as to terminate an electric field exceeding $E_c$ where $E_c$ is a critical electric field for a given device. The doping concentration of the thick p-type base region 640 can be in a range below $1 \times 10^{15}$ cm$^{-3}$, so as to keep the total acceptor dose in the p-type base region 640 below $1 \times 10^{13}$ cm$^{-2}$. An idealized PT thyristor has a near-rectangular electric field profile. A non-punch-through (NPT) thyristor with uniform doping of its thick base will have a triangular electric field profile. As the maximum electric field can be limited by the critical field $E_c$, it is possible, in some implementations, to block almost two times higher voltage with the PT design as compared to a NPT design with the same base thickness. In other PT thyristor implementations, the blocking voltage can be higher or lower than almost two times that of a corresponding NPT design with a same base thickness.

The thyristor 600 (which is a PNPN structure) can be schematically represented as the combination of a PNP BJT (formed from the top three layers) with a bottom NPN BJT (formed from the bottom three layers). In such a representation, a base terminal of the PNP BJT would be common with a collector terminal of the NPN BJT, while the collector terminal of the PNP BJT would be common with the base terminal of the NPN BJT.

The condition for transistor turn-on in the thyristor 600 can be represented as αPNP+αNPN=1, where αPNP and αNPN are the carrier transfer coefficients, α=1−1/β and β is the current gain for respective transistor. It is desirable that that the current gain of the transistors be high enough to ensure reliable thyristor turn-on and low on-state resistance. For the thyristor 600 it may be desirable to use Ga acceptor doping in the depletion stopper layer 646, which typically has a relatively high dose of acceptors. Ga doping can be also be used in the thick low-doped p-type base region 640, however that may also result in relatively high resistance of this region under equilibrium conditions. Such high resistance may not necessarily affect operation in a fully turned-on device. However, during a turn-on transient (transition) this high resistance may result in increased energy losses because of a relatively high forward voltage drop. In certain implementation, a combination of Ga and Al doping may be used in the thick base region 640 in order to reduce the resistance of the base region 640.

In the thyristor 600, the anode 680 can be predominantly doped with Al acceptors rather than with Ga acceptors. The high ionization energy of Ga acceptors in SiC can decrease the emitter efficiency of the anode region 680 if Ga doping were applied to the anode. Such decreased emitter efficiency is undesirable, which is why it is desirable to dope the anode 680 with only Al acceptors, or predominantly with Al acceptors.

Figure 7:
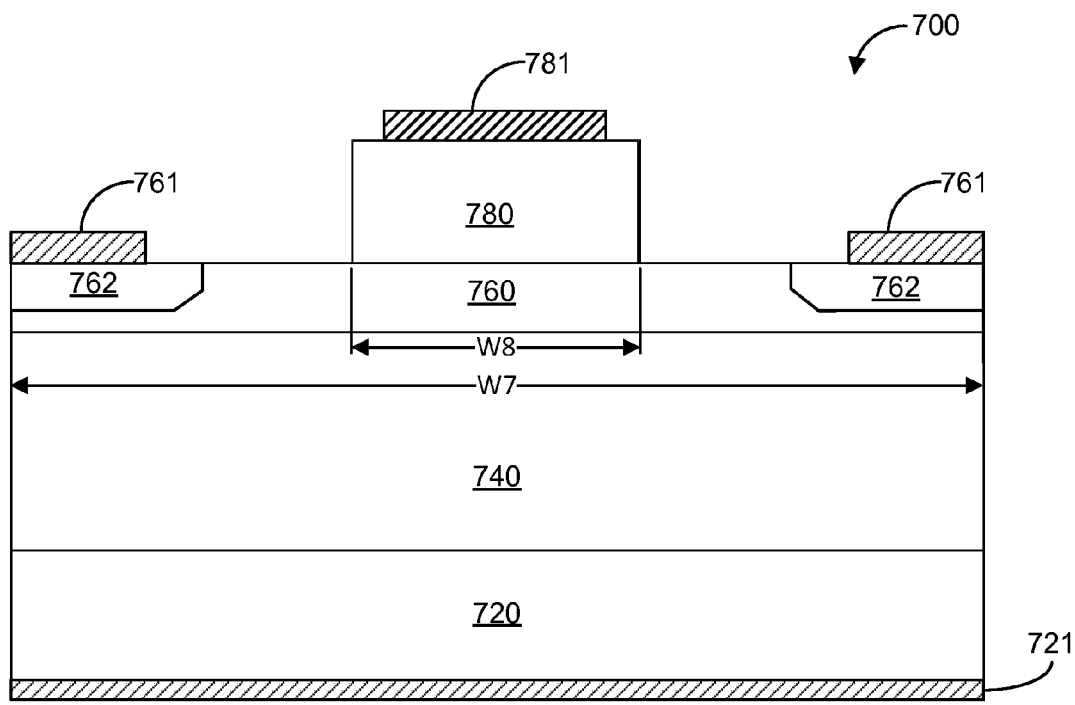
FIG. 7 is a cross-sectional view of a non-punch-through (NPT) thyristor.

FIG. 7 shows a SiC NPT thyristor carbide according to further embodiment. The thyristor 700 includes n-type SiC cathode 720. An Ohmic contact 721 can be formed on the cathode 720. The thyristor 700 further includes p-type base region 740 that is disposed on the p-cathode layer 720. The thyristor 700 shown in FIG. 7 also includes an n-type base region 760, having a width W7, disposed on the p-type base region 740 and a p-type anode 780, having a width W8, disposed on the n-type base region 760. Further, the thyristor 700 includes Ohmic contacts 761 to the n-type base region 760 that are disposed on n+ implant regions 762 that are disposed in the n-type base region 760.

The p-type base region 740 can be doped using Ga acceptors, such that at least ⅓ of the total acceptor dose is Ga. The remaining portion of the acceptors in the base region 740 may be Al acceptors. The anode 780 can be predominantly doped with Al acceptors. The use of Ga acceptors at in the doping of base region 760 can increase the current gain (ECG) of the bottom PNP transistor of the thyristor 700. This increase in current gain, in turn, decreases the forward drop of the thyristor 700, as well as the turn-on base current, both of which may be desirable.

Figure 8:
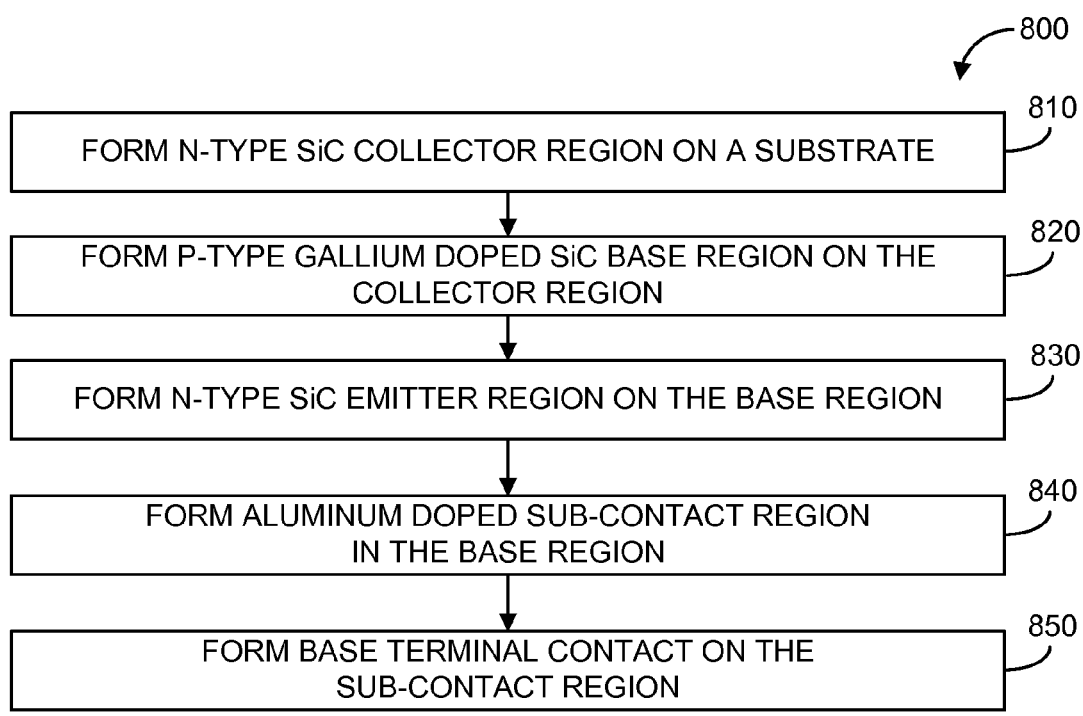
FIG. 8 is a flowchart illustrating a method of forming a BJT.

FIG. 8 is a flowchart illustrating a method 800 that may be used to produce a SiC BJT, such as the BJTs described above. The method 800 includes, at block 810, forming an n-type SiC collector region (or layer) on a substrate, such as a SiC substrate, or other appropriate substrate. At block 820, the method 800 includes forming a p-type gallium doped (at least partially) SiC base region (or layer) on the collector region. At block 830, the method 800 includes forming an n-type SiC emitter region (or layer) on the base region. In certain embodiments, the emitter region can be an overgrown emitter, such as the emitter region of the BJT 300 shown in FIG. 3. At block 840, the method 800 includes forming an aluminum doped sub-contact region in the base region. At block 850, the method 800 includes forming a base terminal contact on the sub-contact region.

Figure 9:
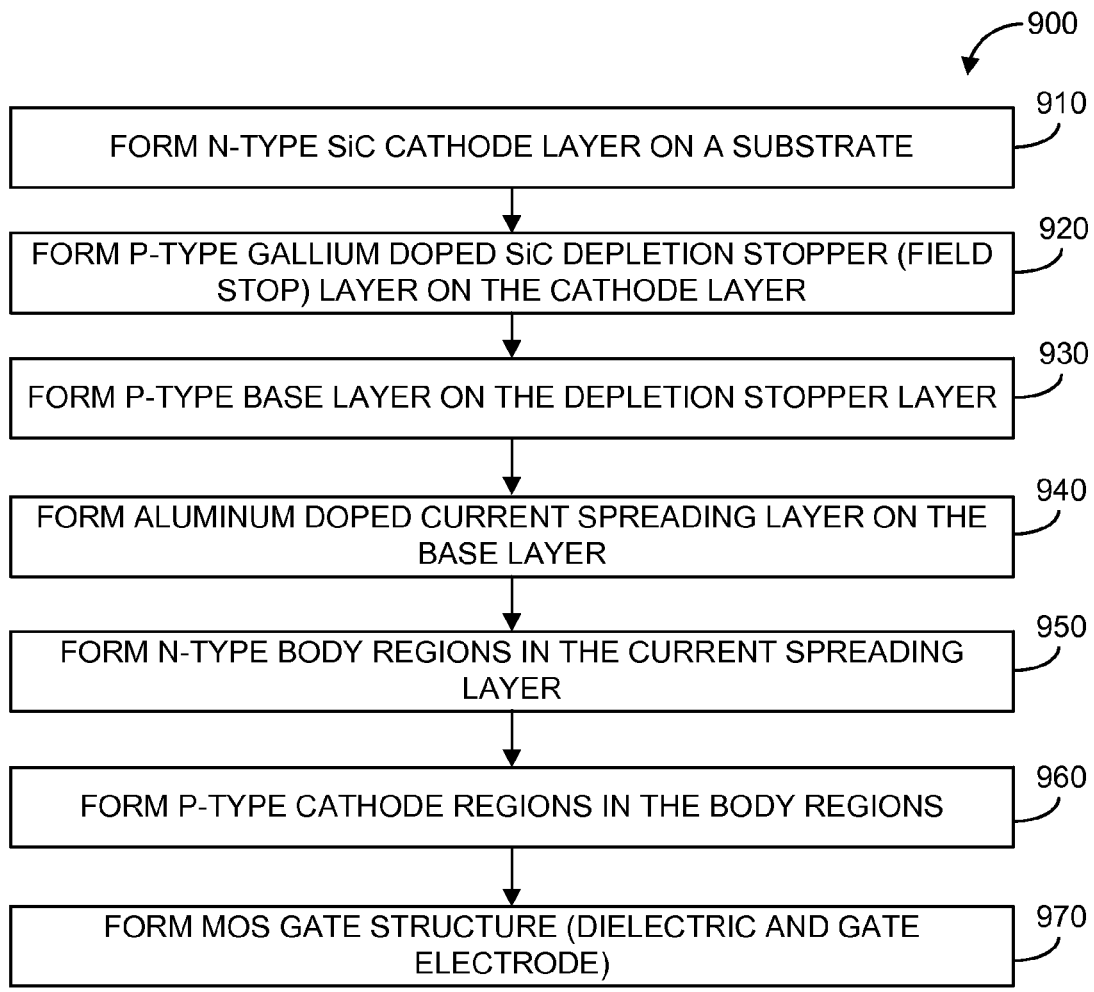
FIG. 9 is a flowchart illustrating a method of forming an IGBT.

FIG. 9 is a flowchart illustrating a method 900 that may be used to produce a SiC IGBT device, such as the IGBT 500 illustrated in FIG. 5. The method 900 includes, at block 910, forming an n-type SiC cathode layer (or region) on a substrate, such as a SiC substrate or other appropriate substrate. At block 920, the method 900 includes forming a p-type Ga doped SiC depletion stopper (field stop layer) on the cathode layer. At block 930, the method 900 includes forming a p-type base layer (which may be Al doped to reduce on-state resistance) on the depletion stopper layer. At block 940, the method 900 includes forming an Al doped current spreading layer on the base layer. At block 950, the method 900 includes forming one or more n-type body regions in the current spreading layer and, at block 960, forming one or more p-type cathode regions in the one or more n-type body regions. For the one or more p-type cathode regions may also include forming respective Ohmic contacts for each of the cathode regions. At block 970, the method 900 includes forming an MOS gate structure, including a gate dielectric and a gate electrode.

Figure 10:
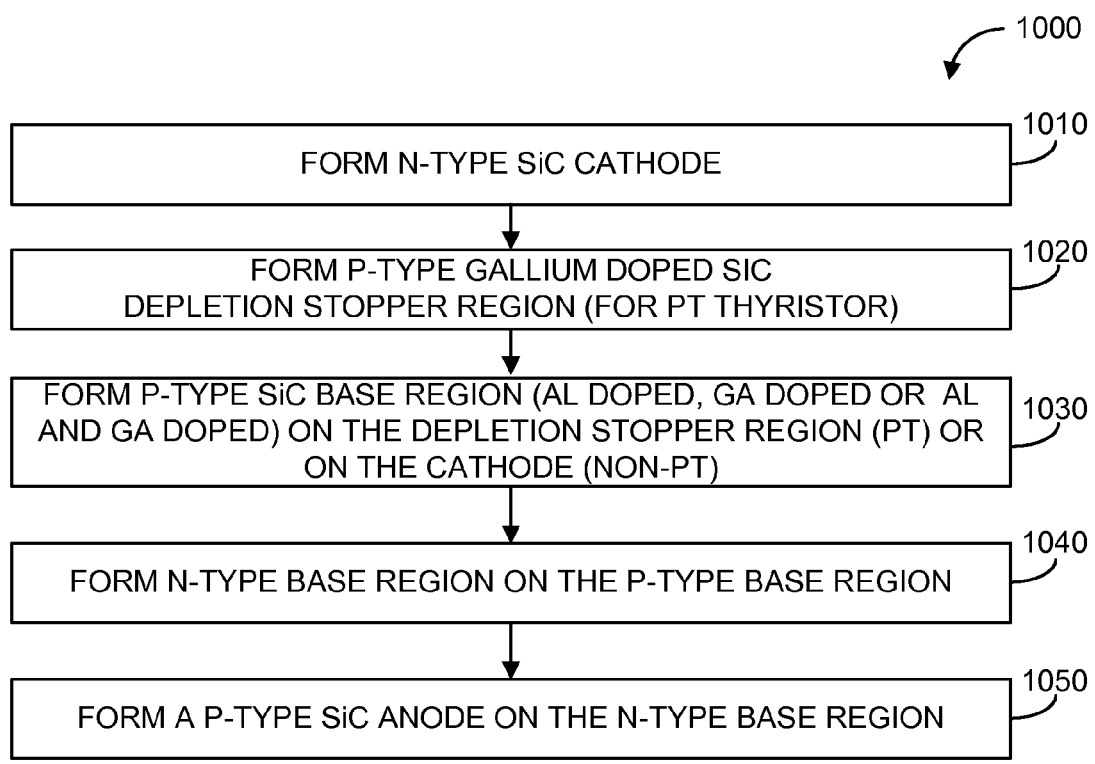
FIG. 10 is a flow chart illustrating a method for forming a (PT or NPT) thyristor.

FIG. 10 is a flowchart illustrating a method 1000 that may be used to produce SiC carbide thyristors, such as the thyristors described herein, e.g., with respect to FIGS. 6 and 7. The method 1000 includes, at block 1010, forming an n-type SiC cathode (region or layer). At block 1020, the method 1000 includes (for PT thyristors) forming a p-type Ga doped SiC depletion stopper (field stop) region (layer). At block 1030, the method includes, forming a p-type SiC base region (layer). The p-type base region, for PT thyristors, can be formed on the depletion stopper layer and, for non-PT thyristors, can be formed on the cathode (layer or region). The p-type base region can be Al doped, Ga doped or co-doped with Al and Ga. At block 1040, the method 1000 includes forming an n-type base region (e.g., including sub-contact regions) on the p-type base region (layer). At block 1050, the method includes forming a p-type SiC anode region (layer) on the n-type base region (layer). The method 1000 may also include forming Ohmic contacts to the sub-contact regions and the p-type anode region.

In a general aspect, a power semiconductor device can include a collector region disposed on a substrate, the collector region can include n-type silicon carbide (SiC). The power semiconductor device can also include a base region disposed on the collector region. The base region can include p-type SiC doped with gallium. The power semiconductor device can include an emitter region disposed on the base region. The emitter region can include n-type SiC carbide.

Example implementations can include one or more of the following features. For instance, the power semiconductor device can be one of a bipolar junction transistor (BJT), an insulated-gate bipolar transistor (IGBT) and a thyristor.

The power semiconductor device can include an Ohmic contact. The Ohmic contact can include a sub-contact region disposed in the base region and laterally spaced from the emitter region. The sub-contact region can be doped with aluminum. The Ohmic contact can include a base terminal contact disposed on the sub-contact region.

The collector region, the base region and the emitter region can be arranged as a vertical stack. The emitter region can be an elevated structure on the stack that is defined by a first sidewall and a second sidewall of the emitter region. An interface between the emitter region and the base region can define an intrinsic base region of the power semiconductor device. In other words, a portion of the base that is vertically disposed (e.g., between the first and second sidewalls) between the emitter region and the collector region can be referred to as the intrinsic base region. The intrinsic base region can include a first portion having a width that is narrower than a width of the emitter region and at least one second portion that is adjacent to the first portion, where the first portion can be thinner than the second portion. The first portion of the intrinsic base region can be substantially centered between the first sidewall and the second sidewall of the emitter region. A portion of the base that is laterally spaced from the emitter region can be referred to as the extrinsic base region.

The power semiconductor device can include a dielectric layer disposed on at least a portion of an upper surface of the emitter region, the first sidewall of the emitter region and a portion of the base region that is adjacent the first sidewall of the emitter region. The portion of the base region adjacent the first sidewall of the emitter region can be a first portion, and the dielectric layer can be disposed on the second sidewall of the emitter region and a second portion of the base region adjacent the second sidewall of the emitter region.

The p-type SiC of the base region can be further doped with aluminum. The p-type SiC of the base region can be a first base region layer, and the power semiconductor device can include a second base region layer disposed on the first base region layer. The second base region layer can include p-type SiC doped with aluminum. A dopant dose of aluminum in the second base region layer can be higher than a dopant dose of gallium in the first base region layer.

The p-type SiC of the base region can be a first base region layer, and the power semiconductor device can include a second base region layer disposed on the first base region layer. The second base region layer can include p-type SiC doped with aluminum. The power semiconductor device can include a third base region layer disposed on the second base region layer. The third base region layer can include p-type SiC doped with gallium.

The collector region can define an n-type cathode of a thyristor. The base region can define a p-type base region of the thyristor. The emitter region can define an n-type base region of the thyristor. The power semiconductor device can include a p-type anode disposed on the n-type region. The power semiconductor device can include a p-type depletion stopper region disposed between the n-type cathode and the p-type base region. The thyristor can be a punch-through thyristor. The thyristor can be a non-punch-through thyristor.

The power semiconductor device can be an insulated-gate bipolar transistor (IGBT). The base region can include a p-type field-stop region of the IGBT. The power semiconductor device can include a p-type drift region disposed between the p-type field stop region and the emitter region and a field effect transistor (FET). The FET can include a source region operationally coupled with the emitter region, a drain region operationally coupled with the base region and a gate terminal configured to control current flow between the source region and the drain region.

The base region can include an intrinsic base region and an extrinsic base region. The intrinsic base region can have a Ga doping concentration that is more than fifty percent of a total acceptor doping concentration of the intrinsic base region. At least a portion of the extrinsic base region can have an aluminum (Al) doping concentration that is more than fifty percent of a total acceptor doping concentration of the extrinsic base region.

In another general aspect, a power bipolar junction transistor (BJT) can include a substrate including n-type silicon carbide (SiC); a buffer layer including n-type SiC; a collector region disposed on the buffer layer, the collector region including n-type SiC; a base region; and an emitter region including n-type SiC. The base region can include a first base layer disposed on the collector region, the first base layer including gallium doped p-type SiC; and a second base layer disposed on the first base layer, the second base layer including aluminum doped p-type SiC, the second base layer having a resistivity that is lower than a resistivity of the first base layer. The base region can have a recess defined therein. The recess can extend through the second base layer to the first base layer. The emitter region can have a first portion disposed in the recess and directly on the first base layer and a second portion disposed directly on the second base layer.

Example implementations can include one or more of the following features. For instance, the power BJT can include a base terminal contact disposed on the second base layer, an interface between the base terminal contact and the second base layer defining an Ohmic contact, and an emitter terminal contact disposed on the emitter region.

The power BJT can include a dielectric layer disposed on at least a portion of an upper surface of the emitter region, a sidewall of the emitter region and a portion of the second base layer that is adjacent the sidewall of the emitter region.

In another general aspect, a power bipolar junction transistor (BJT) can include a substrate including n-type silicon carbide (SiC); a collector region disposed on the substrate, the collector region including n-type SiC; a base region disposed on the collector region, the base region including gallium doped p-type SiC; and an emitter region disposed on the base region, the emitter region having a width that is narrower than a width of the base region. The power BJT can include a sub-contact region disposed in the base region and laterally disposed from the emitter region and a base terminal contact disposed on the sub-contact region.

Example implementations can include one or more of the following features. For instance, the gallium doped SiC of the base region can be further doped with aluminum. The gallium doped SiC of the base region can a first base layer. The base region can include a second base layer disposed on the first base layer. The second base layer can include aluminum doped p-type SiC. The base region can include a third base layer disposed on the second base layer. The third base layer can include gallium doped p-type SiC.

The gallium doped SiC of the base region can be a first base layer. The base region can include a second base layer disposed between the collector region and the first base layer. The second base layer can include aluminum doped p-type SiC.

The power BJT can include a dielectric layer disposed on at least a portion of an upper surface of the emitter region, a sidewall of the emitter region and a portion of the base region adjacent the sidewall of the emitter region.

In another general aspect, a thyristor can include a cathode region including n-type silicon carbide (SiC); a depletion stopper layer disposed on the including gallium doped p-type SiC; a p-type base region disposed on the depletion stopper layer, the p-type base region including p-type SiC; an n-type base region disposed on the p-type base region, the n-type base region including n-type SiC; and an anode region disposed on the n-type base region, the anode region having a width that is narrower than a width of the n-type base region, the anode region including p-type SiC.

Example implementations can include one or more of the following features. For instance, the thyristor can include an Ohmic contact. The Ohmic contact can include a sub-contact region disposed in the n-type base region and laterally spaced from the anode region, where the sub-contact region can include an n+ ion implantation region. The Ohmic contact can include a base terminal contact disposed on the sub-contact region.

The p-type base region can be doped with at least one of aluminum and gallium. The anode region can be doped with aluminum.

In another general aspect, a thyristor can include a cathode region including n-type silicon carbide (SiC); a p-type base region disposed on the cathode region, the p-type base region including gallium doped p-type SiC; an n-type base region disposed on the p-type base region, the n-type base region including n-type SiC; and an anode region disposed on the n-type base region, the anode region having a width that is narrower than a width of the n-type base region, the anode region including aluminum doped p-type SiC. The p-type base region can be further doped with aluminum.

In another general aspect, a method of forming a power semiconductor device can include forming a collector region on a substrate, the collector region including n-type silicon carbide (SiC); forming a base region on the collector region, the base region including p-type SiC doped with gallium; and forming an emitter region on the base region, the emitter region including n-type SiC carbide.

Example implementations can include one or more of the following features. For instance, the collector region can define a cathode of a thyristor; the base region can define a p-type base region of the thyristor, and the emitter region can define an n-type base region of the thyristor. The method can include forming an anode of the thyristor on the n-type base region. The base region can be further doped with aluminum.

The method can include forming an Ohmic contact. Forming the Ohmic contact can include forming a sub-contact region in the base region and laterally spaced from the emitter region, the sub-contact region being doped with aluminum and forming a base terminal contact on the sub-contact region. Forming the sub-contact region can include implanting aluminum in the base region and annealing the power semiconductor device. Forming the sub-contact region can includes defining a recess in the base region and epitaxial growing aluminum doped SiC in the recess.

Forming the emitter region can include defining a recess in the base region and epitaxially growing the emitter region in the recess and on at least a portion of an upper surface of the base region.

The method can include forming a dielectric layer disposed on at least a portion of an upper surface of the emitter region, a sidewall of the emitter region and a portion of the base region adjacent the sidewall of the emitter region.

It will be appreciated that the conductivity types of the different layers in the embodiments described herein may be adapted as desired and that the above described is only an example of conductivity types which may be used for certain SiC power devices, such as BJTs, IGBTs and thyristors, for example.

Further, in the foregoing disclosure, it will be understood that when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures. Further, the terms "layer" and "region" may, in some instances, be used interchangeably.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A power semiconductor device, comprising:
    a collector region disposed on a substrate, the collector region including n-type silicon carbide (SiC);
    a base region disposed on the collector region, the base region including p-type SiC doped with gallium (Ga), the p-type SiC of the base region being further doped with aluminum; and
    an emitter region disposed on the base region, the emitter region including n-type SiC carbide.

2. The power semiconductor device of claim 1, wherein the power semiconductor device is one of a bipolar junction transistor (BJT), an insulated-gate bipolar transistor (IGBT) and a thyristor.

3. The power semiconductor device of claim 1, further comprising an Ohmic contact including:
    a sub-contact region disposed in the base region and laterally spaced from the emitter region, the sub-contact region being doped with aluminum; and
    a base terminal contact disposed on the sub-contact region.

4. The power semiconductor device of claim 1, wherein:
    the collector region, the base region and the emitter region are arranged as a vertical stack, the emitter region being an elevated structure on the stack that is defined by a first sidewall and a second sidewall of the emitter region; and
    an interface between the emitter region and the base region defines an intrinsic base region of the power semiconductor device.

5. The power semiconductor device of claim 4, wherein the intrinsic base region includes a first portion having a width that is narrower than a width of the emitter region and at least one second portion that is adjacent to the first portion, the first portion being thinner than the second portion.

6. The power semiconductor device of claim 5, wherein the first portion of the intrinsic base region is substantially centered between the first sidewall and the second sidewall of the emitter region.

7. The power semiconductor device of claim 4, further comprising a dielectric layer disposed on at least a portion of an upper surface of the emitter region, the first sidewall of the emitter region and a portion of the base region that is adjacent the first sidewall of the emitter region.

8. The power semiconductor device of claim 7, wherein the portion of the base region adjacent the first sidewall of the emitter region is a first portion, the dielectric layer being further disposed on the second sidewall of the emitter region and a second portion of the base region adjacent the second sidewall of the emitter region.

9. The power semiconductor device of claim 1, wherein the p-type SiC of the base region is a first base region layer, the power semiconductor device further comprising:
a second base region layer disposed on the first base region layer, the second base region layer including p-type SiC doped with aluminum.

10. The power semiconductor device of claim 9, wherein a dopant dose of aluminum in the second base region layer is higher than a dopant dose of gallium in the first base region layer.

11. The power semiconductor device of claim 1, wherein the p-type SiC of the base region is a first base region layer, the power semiconductor device further comprising:
a second base region layer disposed on the first base region layer, the second base region layer including p-type SiC doped with aluminum; and
a third base region layer disposed on the second base region layer, the third base region layer including p-type SiC doped with gallium.

12. The power semiconductor device of claim 1, wherein the collector region defines an n-type cathode of a thyristor, the base region defines a p-type base region of the thyristor and the emitter region defines an n-type base region of the thyristor,
the power semiconductor device further comprising a p-type anode disposed on the n-type base region.

13. The power semiconductor device of claim 12, further comprising a p-type depletion stopper region disposed between the n-type cathode and the p-type base region, the thyristor being a punch-through thyristor.

14. The power semiconductor device of claim 1, wherein the power semiconductor device is an insulated-gate bipolar transistor (IGBT), the base region including a p-type field-stop region of the IGBT, the power semiconductor device further comprising:
a p-type drift region disposed between the p-type field stop region and the emitter region; and
a field effect transistor (FET) including:
a source region operationally coupled with the emitter region;
a drain region operationally coupled with the base region; and
a gate terminal configured to control current flow between the source region and the drain region.

15. The power semiconductor device of claim 1, wherein:
the base region includes an intrinsic base region and an extrinsic base region,
the intrinsic base region has a Ga doping concentration that is more than fifty percent of a total acceptor doping concentration of the intrinsic base region, and
at least a portion of the extrinsic base region has an aluminum (Al) doping concentration that is more than fifty percent of a total acceptor doping concentration of the extrinsic base region.

16. The power semiconductor device of claim 1, wherein:
the base region includes an intrinsic base region and an extrinsic base region; and
the emitter region is disposed on the intrinsic base region, the power semiconductor device further comprising a base contact including:
a sub-contact region disposed in the extrinsic base region; and
a base terminal contact disposed on the sub-contact region, the intrinsic base region being predominantly doped with gallium, and
the extrinsic base region being predominantly doped with aluminum at least in the sub-contact region.

17. A power bipolar junction transistor (BJT), comprising:
a substrate including n-type silicon carbide (SiC);
a buffer layer including n-type SiC;
a collector region disposed on the buffer layer, the collector region including n-type SiC;
a base region including:
a first base layer disposed on the collector region, the first base layer including gallium doped p-type SiC, the gallium doped p-type SiC of the first base layer being further doped with aluminum; and
a second base layer disposed on the first base layer, the second base layer including aluminum doped p-type SiC, the second base layer having a resistivity that is lower than a resistivity of the first base layer,
the base region having a recess defined therein, the recess extending through the second base layer to the first base layer; and
an emitter region including n-type SiC, the emitter region having
a first portion disposed in the recess and directly on the first base layer; and
a second portion disposed directly on the second base layer.

18. The power BJT of claim 17, further comprising:
a base terminal contact disposed on the second base layer, an interface between the base terminal contact and the second base layer defining an Ohmic contact; and
an emitter terminal contact disposed on the emitter region.

19. The power BJT of claim 17, further comprising a dielectric layer disposed on at least a portion of an upper surface of the emitter region, a sidewall of the emitter region and a portion of the second base layer that is adjacent the sidewall of the emitter region.

20. A power bipolar junction transistor (BJT), comprising:
a substrate including n-type silicon carbide (SiC);
a collector region disposed on the substrate, the collector region including n-type SiC;
a base region disposed on the collector region, the base region including gallium doped p-type SiC, the gallium doped SiC of the base region being further doped with aluminum;
an emitter region disposed on the base region, the emitter region having a width that is narrower than a width of the base region;
a sub-contact region disposed in the base region and laterally disposed from the emitter region; and
a base terminal contact disposed on the sub-contact region.

21. The power BJT of claim 20, wherein the gallium doped SiC of the base region is a first base layer, the base region further including a second base layer disposed on the first base layer, the second base layer including aluminum doped p-type SiC.

22. The power BJT of claim 21, wherein the base region further includes a third base layer disposed on the second base layer, the third base layer including gallium doped p-type SiC.

23. The power BJT of claim 20, wherein the gallium doped SiC of the base region is a first base layer, the base region further including a second base layer disposed between the collector region and the first base layer, the second base layer including aluminum doped p-type SiC.

24. The power BJT of claim 20, further comprising a dielectric layer disposed on at least a portion of an upper surface of the emitter region, a sidewall of the emitter region and a portion of the base region adjacent the sidewall of the emitter region.

* * * * *